United States Patent [19]

Doddrell et al.

[11] Patent Number: 5,289,127

[45] Date of Patent: Feb. 22, 1994

[54] CORRECTION OF SIGNAL DISTORTION IN AN NMR APPARATUS

[75] Inventors: David M. Doddrell, Westlake; Stuart Crozier, East Brisbane; Michael T. Gladwin, Upper Brookfield, all of Australia

[73] Assignee: The University of Queensland, Australia

[21] Appl. No.: 962,896

[22] Filed: Oct. 19, 1992

[30] Foreign Application Priority Data

Oct. 25, 1991 [AU] Australia ............................... PK 9150
Apr. 30, 1992 [EP] European Pat. Off. ......... 92107428.2

[51] Int. Cl.$^5$ ............................................... G01V 3/00
[52] U.S. Cl. ..................................... 324/314; 324/309
[58] Field of Search ............... 324/300, 307, 309, 314, 324/318, 322

[56] References Cited

U.S. PATENT DOCUMENTS 5,113,865 5/1992 Maeda et al. ...................... 324/309
5,140,268 8/1992 Chan ................................... 324/314

FOREIGN PATENT DOCUMENTS 0283058 9/1988 European Pat. Off. .
0301629 2/1989 European Pat. Off. .
0337588 10/1989 European Pat. Off. .
0391515 10/1990 European Pat. Off. .
0412818 2/1991 European Pat. Off. .
3730148 9/1987 Fed. Rep. of Germany .

OTHER PUBLICATIONS

Journal of Magnetic Resonance vol. 69 pp. 151–155, (Mar. 1986).
Journal of Magnetic Resonance vol. 90 pp. 264–278, (Apr. 1990).

Primary Examiner—Louis Arana
Attorney, Agent, or Firm—Walter A. Hackler

[57] ABSTRACT

Temporal $B_o$ shifts in NMR spectroscopy and/or imaging systems arising from pulsed field gradient induced eddy currents result in the distortion of free induction decay signals. A method of compensation of this distortion through modulation of the sender and/or receiver signal in opposite concert with the induced $B_o$ shifts is introduced. The method has the advantage of having a fast response and of not altering the magnetic gradient field. (FIG. 4)

9 Claims, 8 Drawing Sheets

○ Sampled positions

CORRECTION OF SIGNAL DISTORTION IN AN NMR APPARATUS

FIELD OF THE INVENTION

The invention concerns a method for the correction of distortion of signals in an NMR (nuclear magnetic resonance) spectroscopy and/or imaging device whereby said signal distortion is caused by the switching of gradient magnetic fields and the eddy currents which said switching produces.

DESCRIPTION OF THE PRIOR ART

Correction methods for signal distortions due to the switching of gradient magnetic fields and the eddy currents associated with said switching are known in the art from the German laid open publication DE 3730148A1.

In an NMR spectroscopy and/or imaging device nuclear spins are subjected to a uniform and homogeneous magnetic field and are excited by means of a spin excitation signal from a transmitter. The transmitter emits a radio frequency electromagnetic wave whose frequency is such that there is a resonant matching to the natural Larmor precession frequency in the homogeneous magnetic field of those magnetic spins to be excited. After irradiation of the spin excitation signal the excited nuclear spins precess about the direction of the homogeneous magnetic field vector at a precession angle whose magnitude depends on the strength and duration of the spin excitation signal. If the homogeneous magnetic field is not constant in time but rather exhibits a time dependence then the precession frequency of the excited nuclear spins will change along with this time dependent homogeneous magnetic field. After the magnitude of the magnetic field again assumes the original constant value the precessing spins return to their original procession frequency. However the absolute phase of these spins is shifted with respect to the original phase by an amount depending on the sign, magnitude and duration of the time dependent portion of the $B_0$ magnetic field. A receiver is used to detect the free induction decay (FID) signal which consists of an oscillating part representing the precession frequency of the spins around the direction of the homogeneous magnetic field and an exponential-like envelope representing the relaxation of the spins due to interactions with the lattice (T1) or dipole-dipole interactions with other spins (T2). If detection of the FID signal is undertaken during a period of time in which the magnetic field is changing, the FID signal experiences an undesirable distortion which must be corrected or compensated for. An analogous situation obtains when, instead of the direct FID signal, an echo signal of a spin-echo sequence is detected.

NMR spectroscopy and/or imaging devices require gradient magnetic fields for either volume selective spectroscopy or imaging. The gradient magnetic fields are applied in order to encode certain volume regions of the sample and thereby allow for position sensitive measurements of the nuclear magnetic resonance signal. For three dimensional position measurement three gradient magnetic fields are required. Depending on the application, these fields are applied in sequences usually during differing time intervals and, in general, exhibit differing strengths and gradient directions. Inductive coupling of the current flowing through the coils generating these gradient magnetic fields to other conducting elements causes the current change associated with the switching on and off of a gradient magnetic field to induce current flow in said conducting elements and this current flow, in turn, produces its own magnetic fields. These subsequent magnetic fields are undesirable and, combined with the desired field, produce a total time dependent magnetic field which deviates from the optimum magnetic field for the purpose at hand. The symmetry properties of the generated eddy current magnetic fields reflect the geometry of the conducting elements as well as the symmetry properties of the primary switching field causing said eddy current fields. Particularly disturbing is the eddy current field monopole component, i.e. the uniform magnetic field $B_0$ component, although other components are also present and can also be disturbing as well. This time dependent change in the uniform magnetic field leads to the distortion of the FID or spin-echo signal discussed above. In DE 3730148 A1 the switching of gradient fields in a nuclear magnetic resonance imaging device and the associated production of eddy currents cause field distortions which result in a rapid decay of the echo signals associated with spin echo sequences. The desire, however, to utilize spin echo pulse sequences, in particular, sequences with many spin echos thereby requires a treatment or correction of the distortions due to these eddy current fields. In accordance with the method and procedure of DE 3730148 A1 the dephasing of the produced spin echo sequences due to the disturbing eddy current fields is compensated for by a rephasing condition which is imposed either between the first 90° pulse and the next 180° pulse of a spin echo sequence by changing the magnitude of the static magnetic $B_0$ field or by adjusting the time separation between the first 90° pulse and the subsequent 180° pulse to be one half of that between the subsequent 180° pulses.

The additional time dependent change in the main magnetic field which is required in order to compensate for the dephasing of the spin echo pulses is enacted through the use of an auxiliary correction coil which also produces a largely homogeneous static magnetic field in the same direction as the main field. Through the introduction of a pulse in this auxiliary coil rephasing of the spin echo pulse can be effected. For the rephasing condition to be satisfied, the time dependence of the auxiliary magnetic field is in and of itself unimportant: only the integral of the magnetic field strength must fulfill certain conditions. In particular the time integral of the magnetic field strength over the time interval between the first 90° pulse and the second 180° pulse has to be half as large as the time integral of the magnetic field strength over the interval between the 180° pulses.

The $B_0$ pulse disclosed by DE 3730148 A1 technique is effective and appropriate for the case of a spin echo pulse sequence since the main requirement is that the dephasing condition, on the average, be compensated for. However, the detailed behaviour of FID and spin-echo signals, in particular their phase distortion, reflect not only the average behaviour of the eddy current fields but also their specific time dependence, which, in this procedure is not taken into account.

Other methods for correcting distortions of signals due to eddy currents associated with the switching magnet field gradients are given in the Journal of Magnetic Resonance 90, page 264–278 (1990). This article concerns itself with the class of correction procedures known as preemphasis pulses. For these types of correction procedures, the time dependence of the switching current which is delivered to the magnetic field gradient is modified in such a fashion that the resulting magnetic field is the desired magnetic field. That is to say, the distortion of the magnetic field which would otherwise occur due to eddy currents, is compensated for by actually changing the current distribution and its time dependence fed into the switching gradient magnet in order to produce the gradient field desired. The required pulse current distribution is extracted through an analysis of the multi-exponential decaying eddy currents which lead to the undesired distortion of images and/or spectra. In particular, the correction current is determined through an analysis of the free induction decay signals, whereby both the time dependence of the gradient field and the $B_o$ shift associated therewith can be extracted. A multi-exponential fit through the measured time dependent behaviour of the gradient fields leads to the amplitudes and time constants of the various exponential decay currents caused by the eddy current fields. After compensation of the gradient field component is achieved, the time dependent shift in the $B_o$ field is measured and through further adjustment of exponential preemphasis current fit parameters, similarly corrected for. In order to effect the exact shape for the eddy current compensation pulses, a multi-exponential function is required.

Such preemphasis type corrections, which are basically intended to produce additional fields in order to compensate for the field distortions caused by the eddy currents, require complicated hardware capable of simulating multi-exponential current distributions. Such methods are difficult to realize and of limited effectiveness, in particular as is usually the case in magnetic resonance imaging tomography, when three perpendicular gradient fields with various strengths and time dependences must be compensated for.

Other techniques for the correction of signal distortion from $B_o$ field shifts due to eddy currents effectively involve a software deconvolution of the distorted signal. As discussed in Journal of Magnetic Resonance 69, 151-155 (1986) such software correction measurements can allow for the effective removal or correction of time dependent field shifts following gradient pulses. The correction term must be evaluated individually for each gradient pulse sequence and is then applied to all subsequent data taken with this pulse sequence. In such software correction procedures a reference spectrum is taken, for example, a water signal, under the influence of a certain sequence of gradient fields. The distorted reference resonance line is then essentially deconvoluted for the time dependent distortion due to the eddy current fields and, in this fashion, the signal distortion correction is extracted. The procedure is then verified by applying this software correction to the reference line itself. When the correction is properly applied the reference line shows a clean spectral shape without distortions. Once the correction algorithm has been optimized for the reference line, it is then applied to the other spectral lines. The procedure is therefore particularly suited for spectroscopic applications where an entire spectrum of lines is to be measured.

Software corrections of this nature can always be applied to spectra retroactively. However hardware corrections, where possible, are always preferable since they can be effected in real time, i.e. quickly, and have intrinsically superior signal to noise performance. Moreover the ability to perform a hardware correction does not preclude combining this correction with software enhancement techniques to thereby further improve performance.

Due to the above mentioned deficiences in prior art it is the purpose of the present invention to develop a method for the correction of distortions in an NMR spectroscopy and/or imaging apparatus induced by eddy current fields which is simple to effect, can be implemented in hardware, and does not require modification of currents flowing through gradient coils.

BRIEF SUMMARY OF THE INVENTION

The purpose according to the invention is achieved in that correction for the signal distortion is effected through a compensation of the signal by phase modulation of the transmitter and/or receiver. The invention takes advantage of the realization that the primary effect of the eddy current on the signal is a time dependent shift of the $B_o$ magnetic field which, in turn, leads to a time dependent phase modulation of the signal. The required correction is therefore essentially a phase modulation correction which can be applied in hardware at as early a stage as possible in order to correct the signal for the distortions due to eddy current fields. By enacting the correction as a hardware phase modulation of the transmitter and/or receiver signal, the signal emerging from the NMR apparatus is fully compensated for eddy current distortions prior to subsequent digitization and signal processing steps. In this fashion the correction is applied in hardware and at an earlier stage so that optimal signal to noise ratios and resolution performance can be effected in real time.

In a preferred embodiment of the invention the phase modulation is applied directly to the transmitter.

This measure has the advantage that the transmitter signal is phase modulated in such a fashion that the nuclear spins excited by the signal themselves experience a phase modulation which is such that distortions in the phase development of the signal which would otherwise occur as a result of the eddy currents are compensated for in the excitation of the nuclear spins themselves. In complicated pulse sequences nuclear spin systems are excited, focussed, and reexcited in a sequence of steps necessary to produce images or complicated spectroscopy. The phase and signal distortion resulting from eddy currents induced in previous portions of the pulse sequence therefore act as limitations to subsequent portions of the pulse sequence which degrade performance and limit possible applications. By correcting for eddy current distortions of the signal in the spin system itself the physics of this system is essentially "phase corrected" so that at a fundamental level, the spin system evolves as if the eddy current distortion never occurred.

In a variation of this embodiment the spin excitation signal is phase modulated in the presence of a gradient magnetic field.

In imaging sequences it is common to generate the spin excitation signal in the presence of a gradient, the so-called slice selection gradient. In this case eddy currents due to the switching-on of the slice selection gradient are present during the period of time in which the excitation pulse, in this case a slice excitation pulse, is irradiated. As a result, the spin excitation signal, which was tailored to effect a particular density distribution and thickness of excited spins for excitation in the presence of a slice selection gradient superimposed upon a constant $B_o$ magnetic field, due to the time dependent $B_o$ field, actually produces a distorted slice or slice density distribution. This undesirable excitation profile can be improved by phase modulation of the transmitter signal itself since, in this event, the spin system itself acts in proper phase relationship as if the time dependent magnetic field distortion due to eddy currents had never occurred.

In a further embodiment of the invention the FID signal is phase modulated.

This measure has the advantage that signal distortion in the detected FID signal is eliminated or greatly reduced thereby leading to improved signal-to-noise ratios and resolution. In this embodiment the phase modulation of the invention is actually a demodulation correction of unwanted phase modulations which had already occurred in this signal due to the presence of eddy currents leading to time dependent changes in the $B_o$ field.

In a particularly advantageous embodiment of the invention both the excitation signal and the FID signal are modulated.

This measure has the advantage that, by way of example, distortions of the slice selection excitation profile and/or of the time evolution of the spin system as well as phase distortion and resolution distortion effects related to the detection of a distorted FID signal can be compensated for.

In an embodiment of the method according to the invention a time dependent measurement of a fluctuation of the magnetic field is made for a given switching sequence and on the basis of this measurement the required phase demodulation for the particular sequence is extracted.

This measure has the advantage that the cause of the phase distortion, namely the time dependent shift of the magnetic field, is analytically evaluated and stored for subsequent use. Thereby the fundamental cause of the eddy current signal distortion namely the time changing magnetic field can be stored in a form which can be subsequently applied to any pulse sequence so that proper phase correction can be calculated and applied at any particular given time during subsequent pulse sequences.

In a variation of this embodiment the time dependence of the $B_o$ magnetic field is extracted by time dependent spherical harmonic expansion of the magnetic field.

This measure has the advantage that all general parameters of the magnetic field are in principal known. Spherical harmonic expansion is a most general manner of extracting all the necessary field information in order to provide a complete analysis of the distortion effects. The $B_o$ component, the component leading to the phase distortions which are to be corrected, can be extracted in a straightforward fashion from the full time dependence of the field and the spherical harmonic analysis.

Associated with the application of the method in accordance with the invention is an apparatus for carrying out said method which is characterized by a phase modulation interface unit with a digital NMR converter and an analog interface for effecting the required demodulation. This apparatus has the advantage that the required hardware modifications are included so that an existing NMR spectrometer or tomography apparatus can be retrofitted with the required hardware.

Further details of the invention are disclosed by and can be extracted from the following figures. Clearly these figures can be taken individually or combined with each other without departing from the framework of the invention.

DETAILED DESCRIPTION OF THE PREFERRED EMBODIMENT

Figure 1:
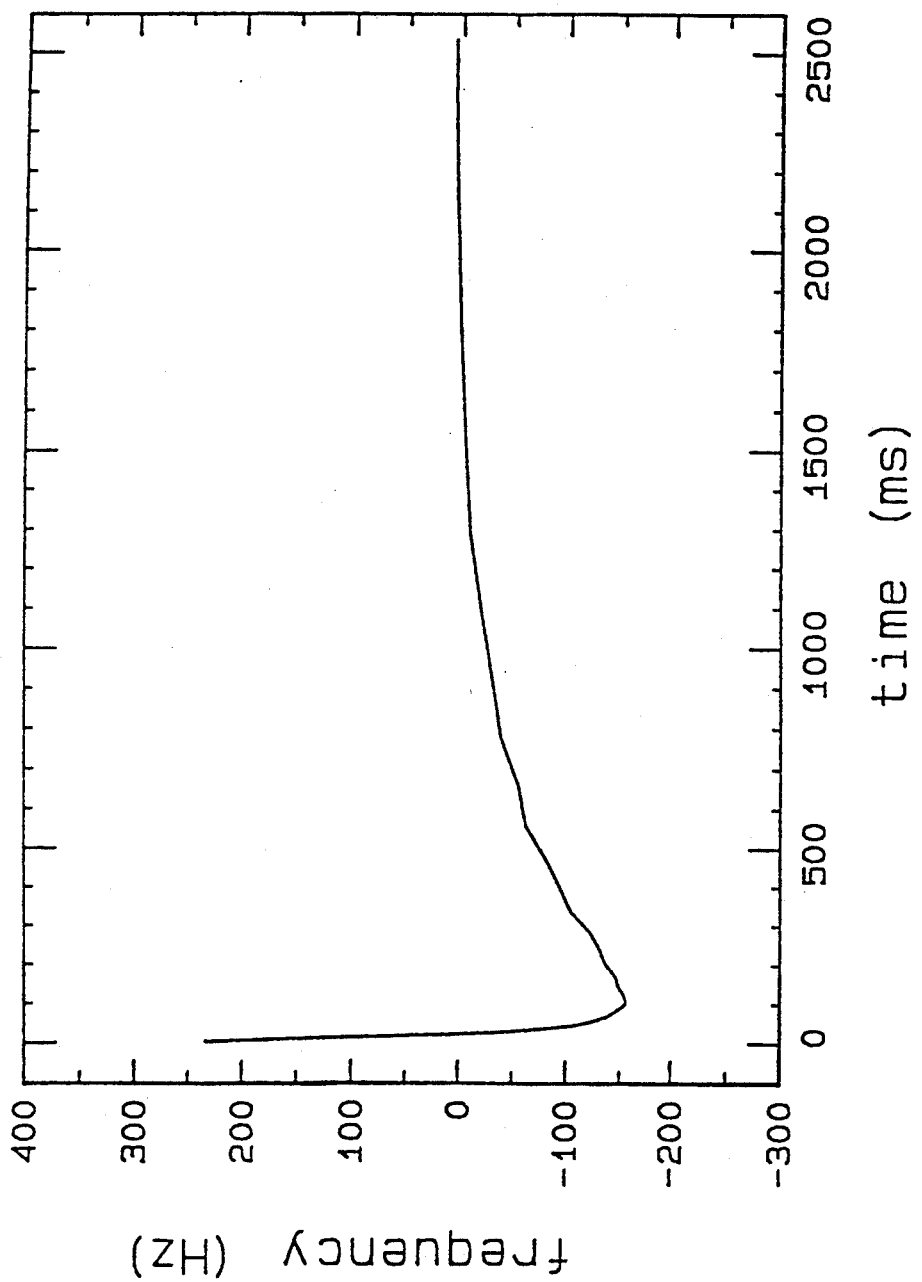
FIG. 1 The time variation of the Larmor frequency associated with the time variation of the $B_o$ magnetic field as a function of time following a three second preemphasized gradient pulse of 2.5 mT/m but without the modulation correction in accordance with the invention.

FIG. 1 shows the $B_o$ response of the system as reflected in the time dependence of the resonant Larmor frequency after a preemphasis y-gradient pulse has been applied. Data were taken with a modified BRUKER MSL 100 console and processed on a work station. The response at 30 temporal points was cubic spline interpolated to 60K points and numerically integrated to provide a digitized version of $$\sigma(t) = \gamma \int_0^t B_0(\tau)d\tau \tag{1}$$

where $\gamma$ is the gyromagnetic ratio and $\sigma(t)$ the time dependent signal phase shift due to eddy current induced time variation of $B_o$. The free induction decay is of the form $$S(t) = S_0 \exp(iwt + \phi + \sigma(t)) \exp(-t/T_2^*) \tag{2}$$

where $\phi$ is a constant. The phase modulation $\sigma(t)$ is, in accordance with the invention, negated and then applied to the receiver or transmitter reference phase. In this way the function to be applied for any sequence can be simply calculated from the $B_o$ harmonic for each of the three gradients at the appropriate switching points of a pulse sequence for given magnitudes of the gradient pulses. The timing for these calculations is slightly longer than the compilation time of the pulse program itself with its associated files.

Figure 2:
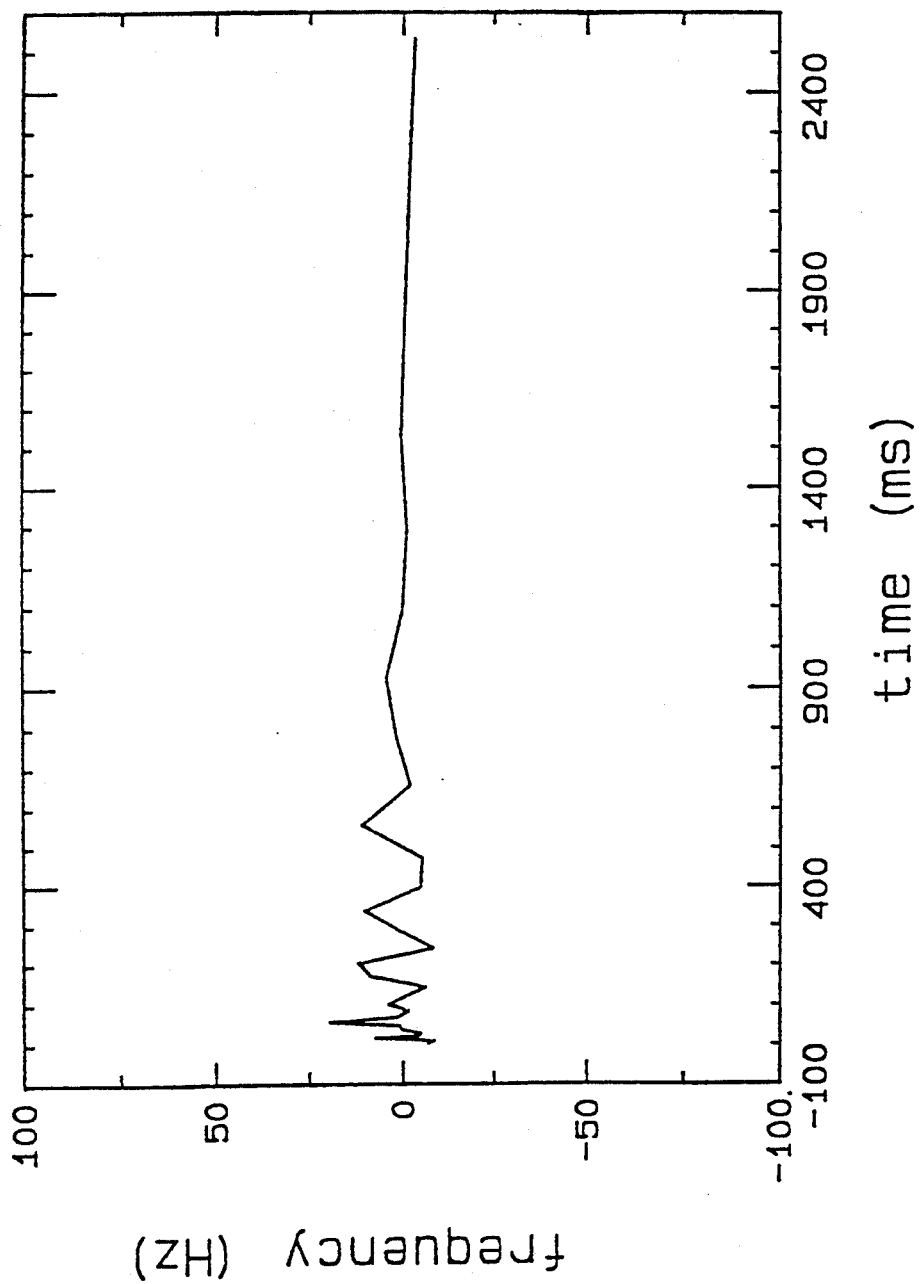
FIG. 2 The time variation of frequency of the NMR signal of FIG. 1 but following signal distortion removal in accordance with the invention.
Figure 3:
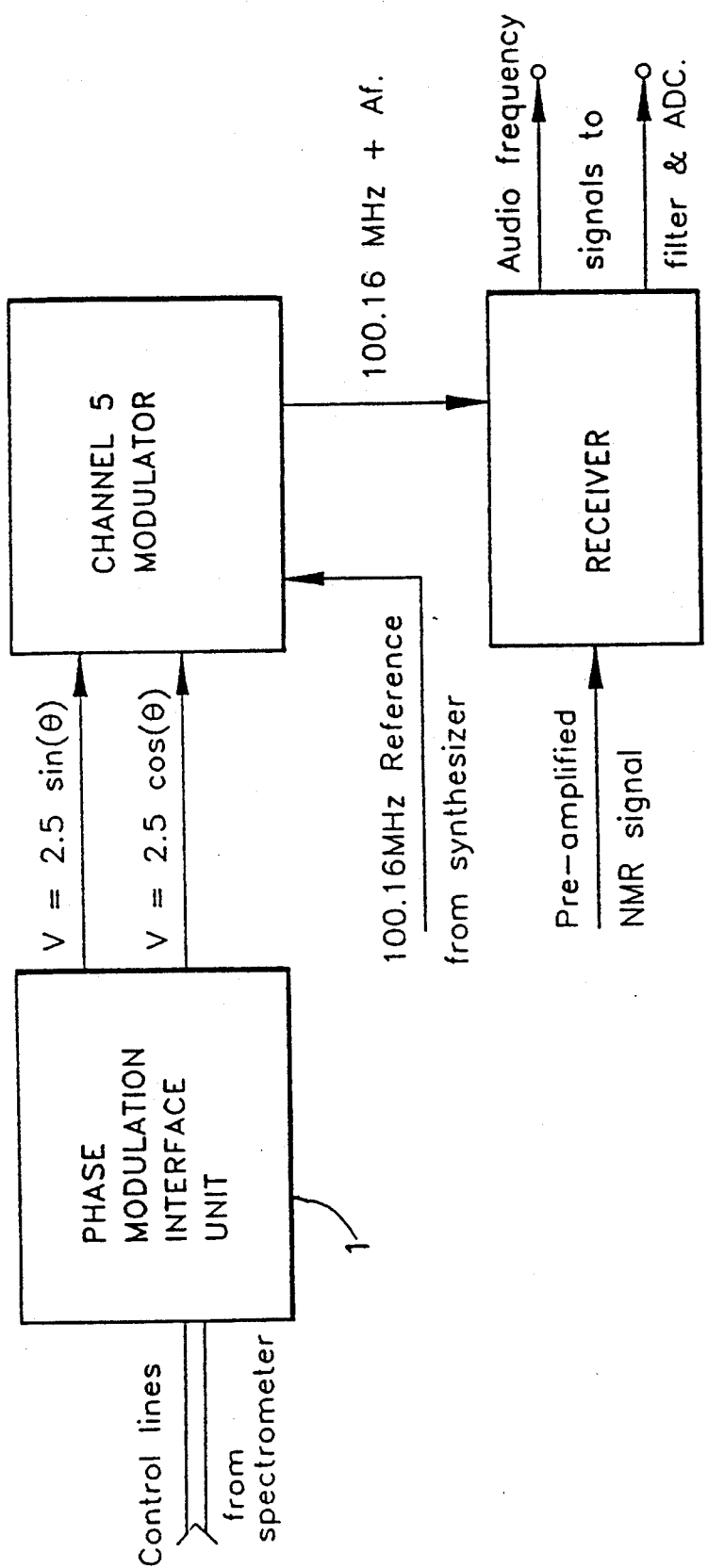
FIG. 3 Block diagram of the utilization of a phase modulation unit in accordance with the invention to phase modulate the receiver signal.
Figure 5:
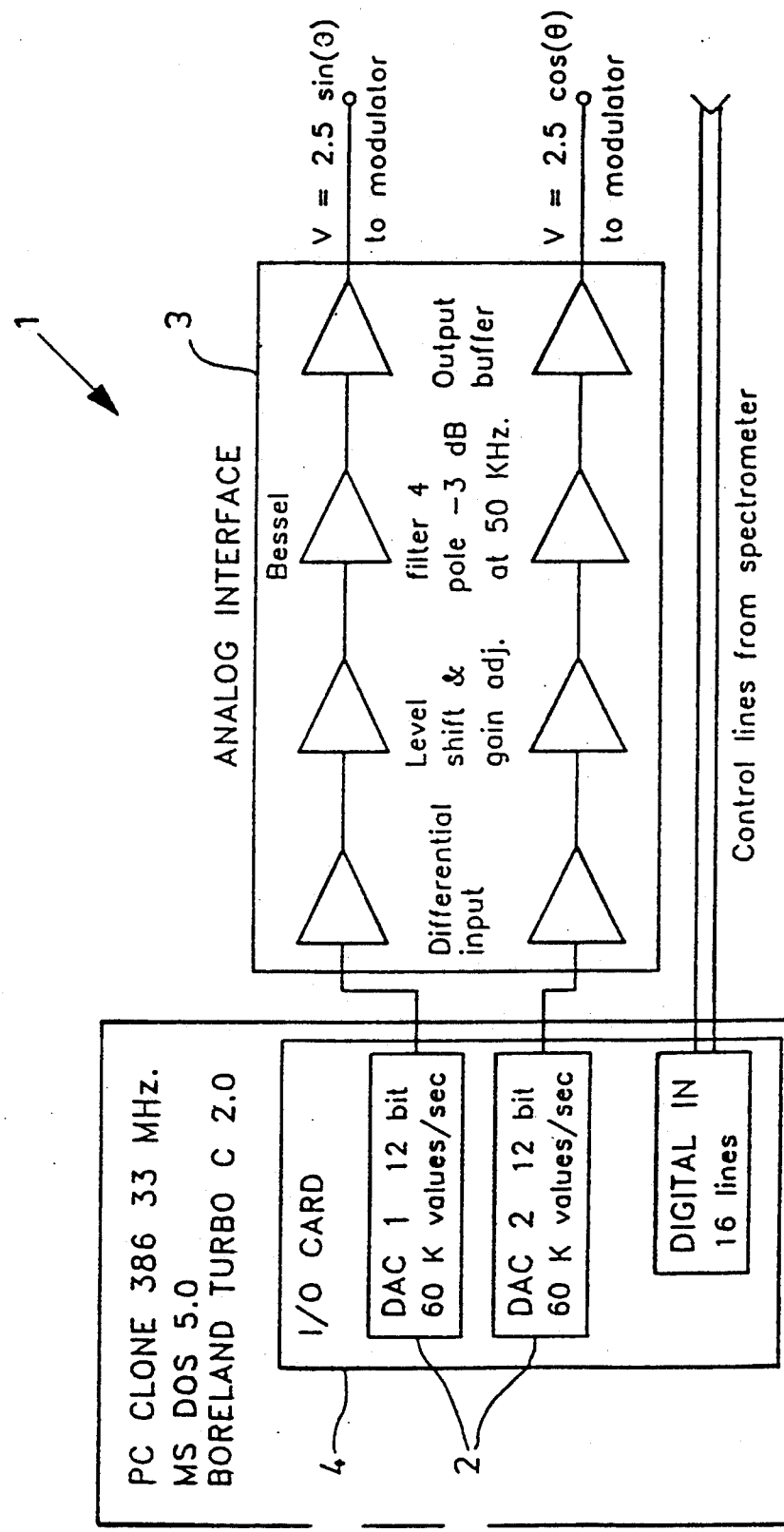
FIG. 5 Block diagram of the phase modulation interference unit according to the invention in particular for use in phase modulation of the receiver.

After applying the correction in accordance with the invention to the receiver for the embodiment of FIGS. 3 and 5, the frequency shift of FIG. 1 is largely compensated for as can be seen in FIG. 2. The residual oscillations are of high frequency character and, with suitable filtering, provide no significant degradation of lineshapes. Note, in particular, the largely expanded scale for the ordinate in FIG. 2. The large amplitude of the $B_o$ shift causing frequency and phase distortion of the signal has been largely compensated for using the phase demodulation method of the invention. The residual displacement of the frequency signal corresponds to approximately 3% of the original displacement.

FIG. 3 shows a block diagram of one embodiment of the invention in which the phase modulation is effected by means of a modulation of the receiver signal, whereby the embodiment is for use in a BRUKER MSL 100 spectrometer. In this embodiment the phase demodulation is triggered by TTL control lines synchronized with the gradient magnet switching. Control lines from the spectrometer feed a phase modulation interface unit 1, the details of which will be discussed in association with FIG. 5. The interface unit has two outputs in quadrature which are then fed into the "channel 5" modulator of the BRUKER MSL 100 system whose 100.16 MHz reference signal from the synthesizer is also represented in the figure. The reference signal output of the "channel 5" modulater thereby includes audio frequency phase modulation, and the modulated reference signal now becomes the new reference signal for the receiver. The preamplified NMR signal enters the receiver and is modulated to produce the audio frequency output signals of the quadrature detector. Clearly the standard BRUKER "channel 5" modulator system illustrated in FIG. 3 can be replaced with any industry standard reference modulator without departing from the framework of the present invention.

Figure 4:
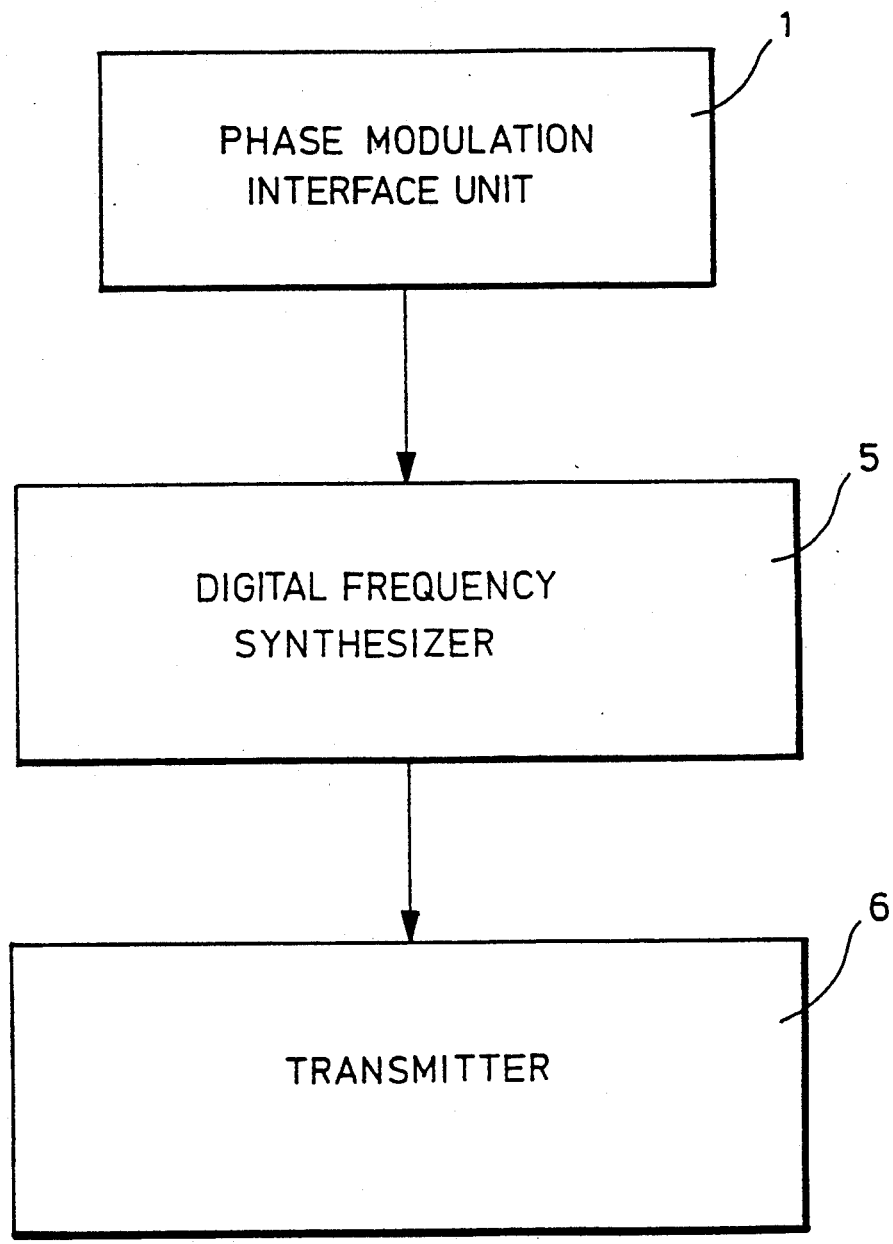
FIG. 4 Block diagram of the utilization of a phase modulation unit in accordance with the invention to phase modulate the transmitter pulse.

FIG. 4 shows a block diagram for effecting a phase modulation of the transmitter 6 and thereby of the spin excitation signal. The digital frequency synthesizer 5 normally used in an NMR spectroscopy or imaging apparatus for pulse programming of pulse shapes and durations as well as frequences, can be modified generally in software but, if necessary, also in hardware in order to effect, when driven by the phase modulation interface unit 1, the desired transmitter 6 phase modulation. Modern digital frequency synthesizers 5 allow for a very flexible programming of the phase of the transmitter 6 excitation signal, thereby allowing for a phase modulation to be easily enacted.

FIG. 5 shows greater detail of an embodiment of the phase modulation interface unit 1 used in the embodiment of FIG. 3 for receiver phase demodulation. This unit was used for testing purposes and consisted of PC based 386 SX system equipped with two 12 bit digital to analog converters 2 and an input/output card 4. The clock frequency was 33 MHz. The system could output a phase file at 50 $\mu$s sampling point intervals representing considerable oversampling of the phase signal and could respond with the delay of 5 to 10 $\mu$s to a spectrometer program gradient episode. The input/output card 4 consisted of two digital to analog converters each 12 bits and capable of 60,000 values per second each of which output into an analog interface 3 consisting of differential, level shift and gain amplifiers as well as a four pole Bessel filter whose transmission response was −3 dB at 50 kHz and an output buffer thereby providing two quadrature output phase modulation signals. As already mentioned, this phase modulation interface unit 1 is particularly useful for phase modulation of the receiver signal, but with appropriate modifications, could also be used to phase modulate the transmitter signal.

Figure 6A:
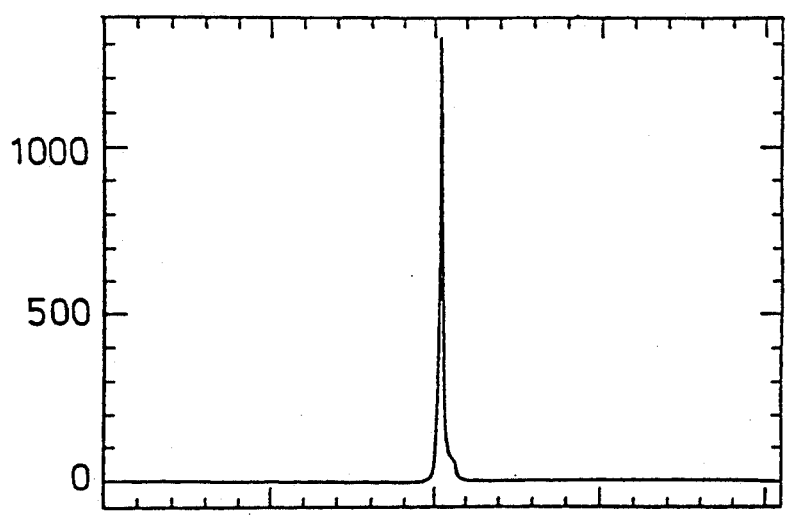
FIG. 6a) A pulse spectrum from a water sample without any gradient pulses.

FIG. 6 shows a pulse spectrum acquired from a 27 cc spherical water sample 0.5 cm from isocenter along the z-axis using a surface coil transmitter/receiver coil. The acquisition time was approximately 200 ms. FIG. 6a shows the Fourier transformed signal without prior switching of a gradient magnet. 3 Hz of exponential line broadening was applied for the signal before Fourier transformation.

Figure 6B:
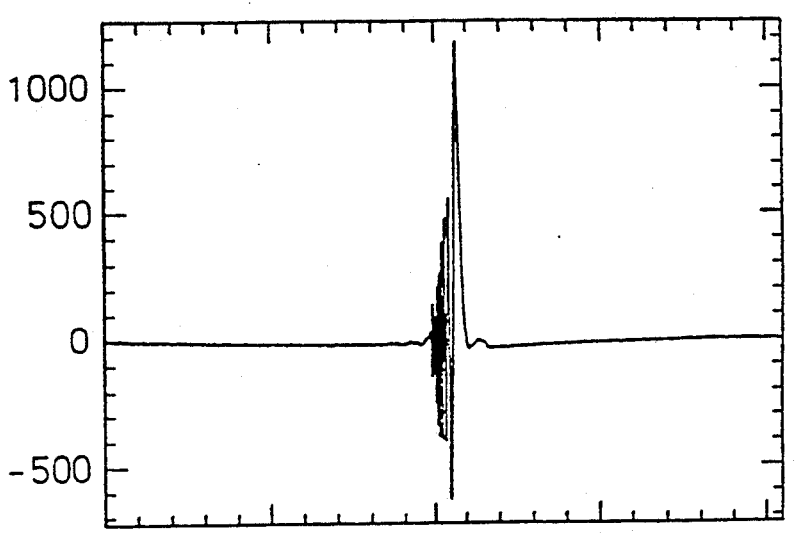
FIG. 6b) signal acquired as the same condition as in a) but 2 milliseconds after a 2.5 mT/m gradient pulse and without $B_o$ compensation according to the invention.
Figure 6C:
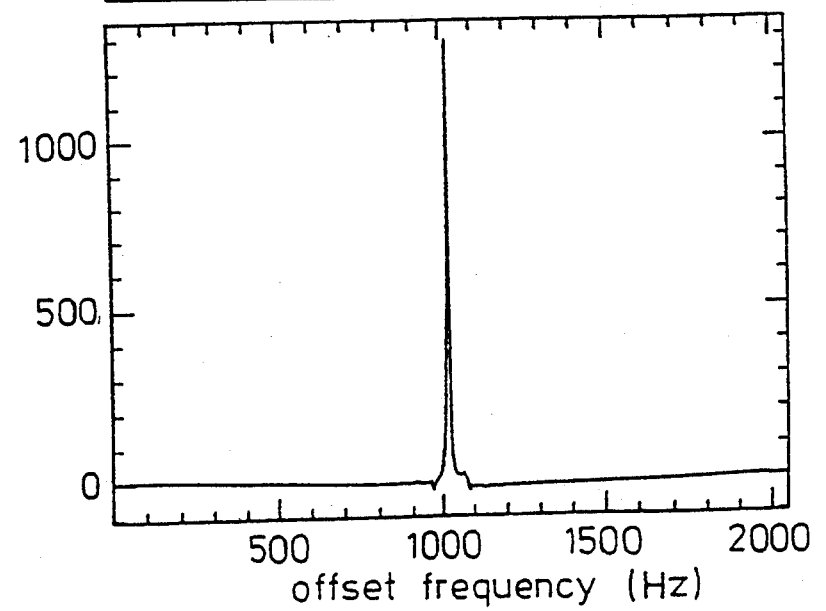
FIG. 6c) as in b) with the compensation scheme in accordance with the invention.

FIG. 6b shows a signal taken under the same conditions as in FIG. 6a except 2 ms after a 2.5 mT/m gradient pulse and without $B_o$ compensation according to the invention. The $B_o$ correction applied in accordance with the invention to the receiver which is associated with the residual $B_o$ field fluctuations of FIG. 2 leads to the results of FIG. 6c where the correction of the $B_o$ shift 2 ms following a preemphasized 100 ms 2.5 mT/m gradient pulse is clearly very good. The small side peaks in the corrected spectrum stem from the inability of the "channel 5" modulator to maintain constant RF fields when being phase modulated. This amplitude modulation of the reference resulted in small side band peaks; the origin of the peaks was verified by the use of various phase modulation patterns and spectral analysis of the reference signal. Clearly these small side peaks are residual and nonfundamental in nature and can be eliminated by proper modification of the modulation unit.

In a preferred embodiment of the invention, the time dependence of the $B_o$ shift is determined through a temporal spherical harmonic expansion of the magnetic field following the gradient pulse. This expansion gives the strength of the harmonic which has the same symmetry as the applied gradient and additionally provides data on more complex field harmonics. The most straightforward approach in obtaining a spherical harmonic expansion of the magnetic field is simply to measure the field at points on a spherical surface surrounding the magnet origin. The spherical harmonics take the form $$B_{znm} = r^n(a_{nm} \cos m\phi + b_{nm} \sin m\phi) P_{nm}(\cos \Theta) \qquad (3)$$

and are solutions to Laplace's equation $\nabla^2 B_z = 0$. The field $B_z$ can be represented in terms of its spherical harmonic components $B_{znm}$ $$B_z(r,\theta,\phi) = \sum_n \sum_m B_{znm}(r,\theta,\phi) \qquad (4)$$

where $B_{znm}$ is the spherical harmonic of order n and degree m, $a_{nm}$ and $b_{nm}$ are constants and r is the radial distance from the magnetic isocenter. $P_{nm}(\cos \theta)$ are the associated Legendre functions.

The spherical harmonic $B_{znm}$ and the surface spherical harmonic $T_{nm}$ where $$T_{nm} = (\cos m\phi + \sin m\phi) P_{nm}(\cos \theta) \qquad (5)$$

have the property of being orthogonal to each other when integrated over the surface of the sphere $$\int_0^{2\pi} \int_{-1}^{1} B_{zm} T_{ij} du d\phi = 0 \quad n \neq i \text{ or } m \neq j \qquad (6)$$

-continued $$= r^n \frac{4\pi}{2n+1} a_{n0}$$
$$n = i \text{ and } j = m = 0$$
$$= r^n \frac{2\pi}{2n+1} \frac{(n+m)!}{(n-m)!} (a_{nm} + b_{nm})$$
$$n = i \text{ and } m = j$$

where $u = \cos\theta$. This integral provides the means by which the spherical harmonic coefficients $a_{nm}$ and $b_{nm}$ can be determined for each spherical harmonic $B_{znm}$. Substituting equations 3 and 5 into equation 6 gives $$\int_0^{2\pi}\int_{-1}^1 B_z(u,\phi)T_{nm}du d\phi = \quad (7)$$

$$\int_{-1}^1 P_{nm}(u)\int_0^{2\pi} B_z(u,\phi)(\cos m\phi + \sin m\phi)d\phi du$$

where $B_{znm}$ has been replaced by the summation given in equation 4. The inner integral on the right hand side is evaluated by Fourier transforming $B_z(u,\phi)$ with respect to $\phi$ for fixed $u$ to give $F(u)$, while the outer integral is evaluated using Gaussian numerical integration. That is $$P_{nm}(u)F(u)du \rightarrow \sum_u P_{nm}(u)W_u F(u) \quad (8)$$

where $W_u$ are the Gauss weighting factors for each point $u$. The coefficients $a$ and $b$ can then be found by equating expressions 6 and 8.

$$b_{n0} = 0 \quad m = 0 \quad (9)$$

$$a_{n0} = r^{-n} \frac{2n+1}{4\pi} \sum_u P_{n0}(u)W_u F^c(u) \quad m = 0$$

$$a_{nm} = r^{-n} \frac{2n+1}{2\pi} \frac{(n-m)!}{(n+m)!} \sum_u P_{nm}(u)W_u F^c(u) \quad m \geq 1$$

$$b_{nm} = r^{-n} \frac{2n+1}{2\pi} \frac{(n-m)!}{(n+m)!} \sum_u P_{nm}(u)W_u F^s(u) \quad m \geq 1$$

where the superscripts $c$ and $s$ refer to cosine and sine Fourier transforms of the azimuthal data.

In experiments leading to the results of FIGS. 2 and 6, the harmonics were evaluated at 30 exponentially weighted temporal points, both during and after a long (3 s) gradient pulse and at 112 spatial positions in seven azimuthal plains over a sphere of 7 cm radius. The use of this type of field measurement provides a wealth of information concerning both the spatial and temporal response of the gradient magnet system.

Figure 7B:
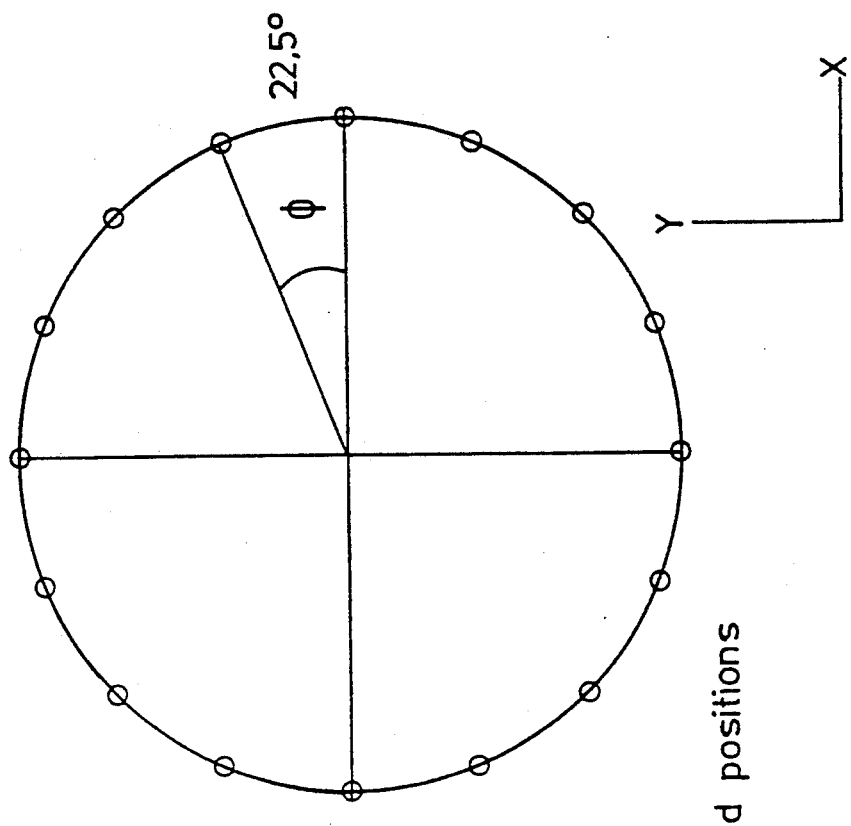
FIGS. 7a) and 7b) Sample positions utilized in the spherical harmonic analysis of the B field in accordance with the invention.
Figure 7A:
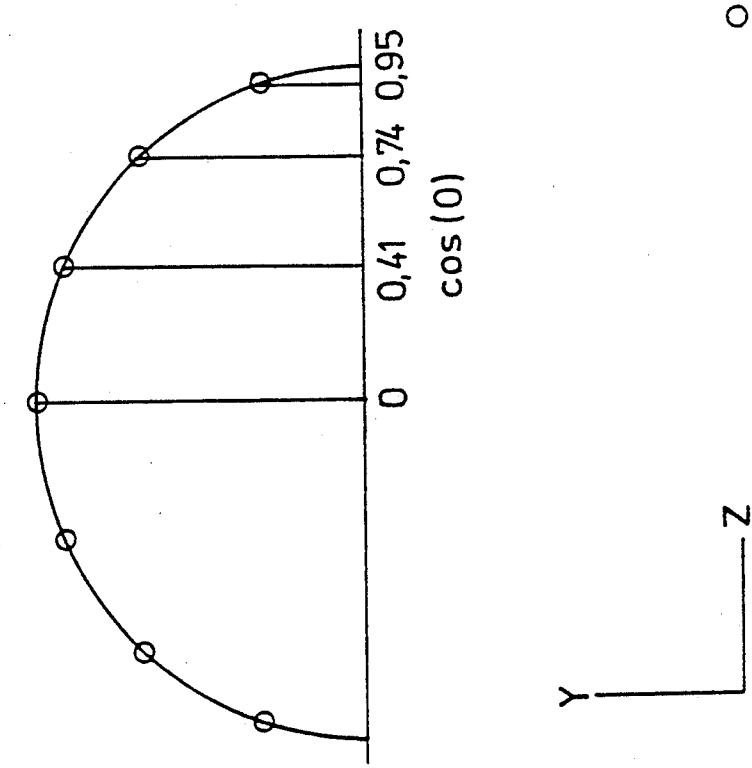

FIG. 7 gives an example of the sample positions used for this spherical harmonic analysis. The field strengths were determined using a radio frequency (RF) probe consisting of seven water samples fixed in the positions indicated in FIG. 7a. The NMR resonance frequency of each sample was monitored by a small RF coil while a relay based switching system allowed for the selection of different coils. Azimutal positions in FIG. 7b were obtained by probe rotation. The water samples were 100 ml each and were mounted in a specially built probe and placed at the positions indicated in FIG. 7a. During the experiment the probe was rotated about the z-axis in 22.5° steps (FIG. 7b) until resonant frequencies from all 112 positions had been acquired.

Figure 8:
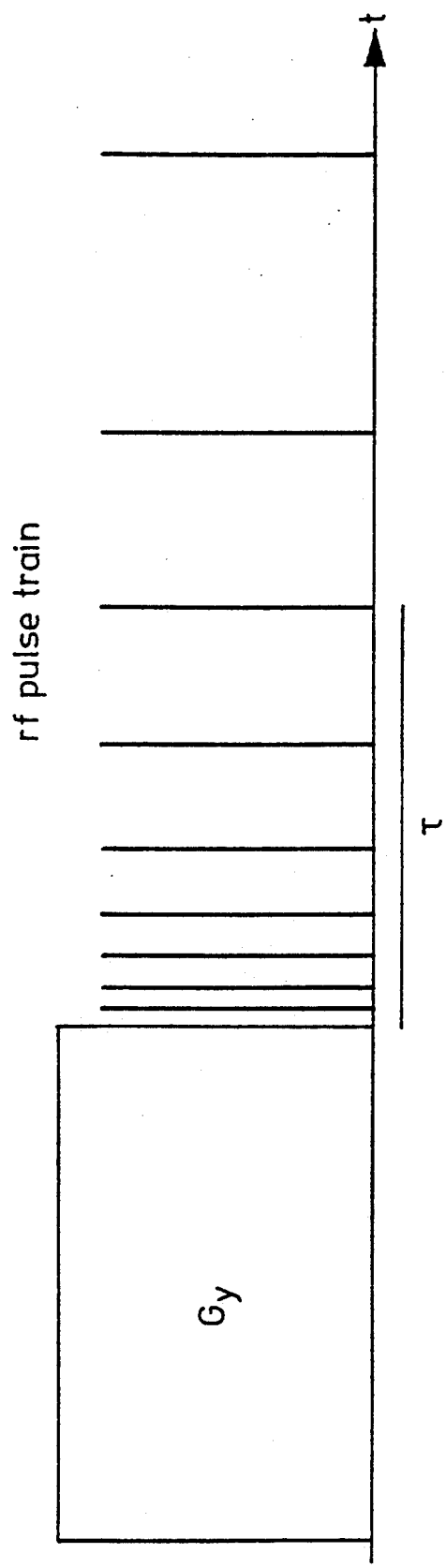
FIG. 8 Pulse sequence used to acquire eddy current field data in accordance with the invention.

As indicated in FIG. 8, the eddy field response following the application of a long (3 s) magnetic field gradient (Gy) of 5 mT/m was monitored by recording 30 free induction decays following excitations with the RF pulse train of FIG. 8 with delays $\tau$ of between 1 ms and 2.5 ms. Small tip angle RF excitation pulses were used in such a fashion that the free induction decays for a single coil could be obtained in a single measurement. For each free induction decay 256 complex data points were acquired in 1.28 ms. During this time the frequency and therefore the field was essentially constant. The delay between free induction decays was increased exponentially with time to allow for accurate fitting of exponentials to the resulting frequency data. Once the complete data set of 3,360 free induction decays was obtained, data were processed by calculating the frequency of each FID. This was done by zero-filling to 4K, Fourier transforming, and then picking the dominant peak position. Alternatively if the signal to noise ratio of the free induction decay was good, the frequency could be more accurately determined by measuring the total phase shift during the free induction decay.

We claim:

1. A method for the compensation of signal distortion in an NMR apparatus, said NMR apparatus comprising a transmitter generating a spin excitation signal and a receiver detecting an NMR signal, and said signal distortion being caused by eddy currents induced by a switching on and off of a gradient magnetic field, said method comprising the steps of:
   A. Determining a time dependence of a magnitude of homogeneous $B_o$ component of a magnetic field and
   B. Phase modulating at least one of said spin excitation signal and said NMR signal to compensate for said time dependence.

2. The method of claim 1, wherein said spin excitation signal is phase modulated.

3. The method of claim 2, wherein said spin excitation signal is phase modulated at a time during which said gradient magnetic field is on.

4. The method of claim 1, wherein said NMR signal is phase modulated.

5. The method of claim 1, wherein said spin excitation and said NMR signals are both phase modulated.

6. The method of claim 1, wherein said signal phase modulation is extracted for a given switching sequence of said gradient magnetic field by an analysis of said time dependence of said $B_o$ component for said given switching sequence.

7. The method of claim 1, wherein said time dependence of said $B_o$ component is extracted by a time dependent spherical harmonic expansion of said magnetic field.

8. The method of claim 7, wherein said magnetic field is measured at points on a spherical surface.

9. An NMR apparatus for the compensation of signal distortion caused by eddy currents induced by a switching on and off of a gradient magnetic field comprising:
   a transmitter to generate a spin excitation signal;
   a receiver to detect an NMR signal;
   phase modulation interference unit means, comprising a digital-to-analog-converter and an analog interface, for, after the time dependence of the magnitude of a homogeneous $B_o$ component of a magnetic field has been determined, phase modulating at least one of the spin excitation signal and the NMR signal, in order to compensate for the $B_o$ magnetic field time dependence.

* * * * *